United States Patent [19]
Satou

[11] Patent Number: 6,051,815
[45] Date of Patent: Apr. 18, 2000

[54] APPARATUS FOR HEAT-TREATING SUBSTRATE AND METHOD FOR SEPARATING THE SUBSTRATE FROM THE APPARATUS

[75] Inventor: Yasuyuki Satou, Tokyo, Japan

[73] Assignee: NEC Corporation, Tokyo, Japan

[21] Appl. No.: 09/262,340

[22] Filed: Mar. 4, 1999

[30] Foreign Application Priority Data

Mar. 5, 1998 [JP] Japan ................................. 10-053243

[51] Int. Cl.⁷ ............................. H05B 3/68; C23C 16/00
[52] U.S. Cl. ...................................... 219/444.1; 118/728
[58] Field of Search ............................. 219/443.1, 444.1, 219/544, 546; 118/728, 729, 621, 725; 279/131, 134, 128; 361/234

[56] References Cited

U.S. PATENT DOCUMENTS

| | | | |
|---|---|---|---|
| 5,226,056 | 7/1993 | Kikuchi et al. ....................... | 219/444.1 |
| 5,569,350 | 10/1996 | Osada et al. ............................. | 118/728 |
| 5,591,269 | 1/1997 | Arami et al. ............................. | 118/728 |
| 5,677,824 | 10/1997 | Harashima et al. ..................... | 361/234 |
| 5,738,165 | 4/1998 | Imai ........................................ | 118/728 |
| 5,777,838 | 7/1998 | Tamagawa et al. ..................... | 361/234 |
| 5,854,468 | 12/1998 | Muka ..................................... | 219/444.1 |
| 5,904,779 | 5/1999 | Dhindsa et al. ......................... | 118/728 |
| 5,946,183 | 8/1999 | Yamada et al. ......................... | 361/234 |

FOREIGN PATENT DOCUMENTS 6-97269  4/1994  Japan .
7-201718  8/1995  Japan .

*Primary Examiner*—Sang Paik
*Attorney, Agent, or Firm*—Sughrue, Mion, Zinn Macpeak & Seas, PLLC

[57] ABSTRACT

In the apparatus for and the method of heat-treating a substrate, the substrate is prevented from bearing any electrostatic charges without fail. A workpiece-carrying platform for carrying the substrate thereon is divided into: a workpiece-carrying platform body forming a major part of the workpiece-carrying platform; and, a lifting/lowering ring plate forming the remaining part of the workpiece-carrying platform. The lifting/lowering ring plate is received in a receiving groove of the workpiece-carrying platform body so as to be capable of being lifted and lowered therein. When the substrate is separated from the workpiece-carrying platform, the lifting/lowering ring plate is first lowered, and then the substrate is lifted by lift pins so that the substrate is lifted in two steps, whereby the contact surface of the substrate with workpiece-carrying platform is separated from the latter stepwise.

40 Claims, 8 Drawing Sheets

APPARATUS FOR HEAT-TREATING SUBSTRATE AND METHOD FOR SEPARATING THE SUBSTRATE FROM THE APPARATUS

BACKGROUND OF THE INVENTION

1. Field of the Invention

The present invention relates to an apparatus for heat-treating a substrate and a method for separating the substrate from the apparatus, the substrate comprising semiconductor wafers, glass substrates for LCDs, and the like.

2. Description of the Related Art

In a process for fabricating semiconductors, it is in widespread use to mount a workpiece such as semiconductor wafers, glass substrates for LCD, and the like on a workpiece-carrying platform and process the workpiece in a predetermined manner. For example, as for an apparatus for heating the substrate, several examples of such apparatus are shown in Japanese Patent Laid-Open Application Nos. Hei7-201718 and Hei6-97269, wherein an apparatus for heat-treating the substrate, i.e., a so-called hotplate is used.

FIGS. 7, 8 and 9 show an example of a conventional apparatus for heat-treating the substrate. This conventional apparatus is provided with: a workpiece-carrying platform 60 for carrying a substrate "G" as a workpiece thereon; a heater element 62 for supplying heat to the substrate "G" through the workpiece-carrying platform 60; a plurality of lift pins 70 for lifting off the substrate "G"; and, a cover member 66 for defining a processing space 64 disposed over the substrate "G" to function to expel gases produced during heating processes of the workpiece. A plurality of through-holes 68 are formed in both the workpiece-carrying platform 60 and the heater element 62. In each of these through-holes 68, each of the lift pins 70 is inserted so as to be capable of moving up and down relative to the through-hole 68. In operation, when the lift pin 70 is moved up and down by a piston 78 of a cylinder mechanism 76, the substrate "G" is transferred from the workpiece-carrying platform 60 to an outside means or vice versa.

In this case, the workpiece-carrying platform 60 is constructed of a square-shaped aluminum alloy plate which is excellent in thermal conductivity and surfaced with an aluminum oxide coating. Further, as shown in FIG. 8, a surface of the workpiece-carrying platform 60 is roughed by the provision of a plurality of concentric annular grooves 71. On the other hand, the heater element 62 is also constructed of an aluminum alloy plate which assumes substantially the same shape in plan view as that of the workpiece-carrying platform 60. Incorporated in this heater element 62 is a heater.

Further, as shown in FIG. 7, a sleeve-like shutter member 80 is disposed around an outer peripheral portion of the workpiece-carrying platform 60 so as to be capable of moving up and down relative to the workpiece-carrying platform 60. This shutter member 80 is connected with a piston 82 of a shutter drive cylinder 82 capable of moving the shutter member 80 up and down. Consequently, it is possible to control the volume of the processing space 64 by moving the shutter member 80 up and down.

Further, as shown in FIG. 8, also provided in an upper surface of the workpiece-carrying platform 60 is a spacer 85 for preventing the substrate "G" from being brought into contact with the workpiece-carrying platform 60. The spacer 85 extends along an outer peripheral portion of a workpiece (i.e., substrate "G") carrying area of the workpiece-carrying platform 60. This spacer 85 is constructed of a flat oval-shaped ceramic segment, and provided with a plurality of through-holes in its end portions, in each of which through-holes a mounting screw 86 is inserted and threadably engaged with a threaded hole 87 formed in the upper surface of the workpiece-carrying platform 60.

Now, the apparatus for heat-treating the substrate "G" will be described in operation.

First, the substrate "G" mounted on the workpiec-carrying platform 60 is transferred to the lift pins 70 having been moved up. When the lift pins 70 are moved down, the substrate "G" is mounted on the spacer 85 over the workpiece-carrying platform 60. Then, the shutter is driven so that a processing section of the apparatus is partitioned off from the outside. In this processing section of the apparatus, heat from the heater element 62 is transmitted to the workpiece-carrying platform 60, and further to the substrate "G" through the upper surface of the workpiece-carrying platform 60. In this case, since heat transmission from the heater element 62 to the workpiece-carrying platform 60 is accomplished through the entire contact surfaces comprising the lower surface of the workpiece-carrying platform 60 and the upper surface of the heater element 62, the workpiece-carrying platform 60 is uniformly heated as a whole. Consequently, the distribution of heat transmitted from the heater element 62 to the substrate "G" through the workpiece-carrying platform 60 is uniform, so that the substrate "G" is uniformly heat-treated.

After completion of the above heat treatment, the substrate "G" is separated from the workpiece-carrying platform 60 when the lift pins 70 are lifted. At this time, however, since the substrate "G", which tends to bear electrostatic charges, is attracted to the surface of the workpiece-carrying platform 60 due to electrostatic charges. Due to such attraction, it is hard to separate the substrate "G" from the workpiece-carrying platform 60, which often causes misalignment in location of the substrate "G", and/or damage of a device due to drop of the substrate "G". Further, there are fears that due to built-up electrostatic charges, fine dirt is attracted, and that due to electrostatic discharge, the device is destroyed.

In this respect, in the above conventional apparatus, since the grooves 71 are provided to such an extent as not to disturb the uniformity in temperature of the surface of the workpiece-carrying platform 60, the build-up of electrostatic charges is suppressed to some extent. Due to this, it is possible to suppress in occurrence the above-mentioned problems.

However, such a provision of the grooves 71 only in the surface of the workpiece-carrying platform 60 is not sufficient to suppress the build-up of the electrostatic charges.

Consequently, the above-mentioned problems inherent in the conventional apparatus are still not completely solved.

SUMMARY OF THE INVENTION

Under such circumstances, the present invention was made. Consequently, it is an object of the present invention to provide an apparatus for heat-treating a substrate and a method for separating the substrate from the apparatus, wherein a phenomenon that the substrate bears electrical charges due to its separation from a wrokpiece-carrying surface is reliably prevented from occurring.

According to a first aspect of the present invention, the above object of the present invention is accomplished by providing:

In an apparatus for heat-treating a substrate comprising: a workpiece-carrying platform for mounting the substrate thereon; a heater element for supplying heat to the substrate on the workpiece-carrying platform through the workpiece-carrying platform; and, a lift pin for lifting the substrate on the workpiece-carrying platform, the lift pin being extended upward from its retracted position disposed inside the workpiece-carrying platform when the substrate is transferred; the improvement wherein:

the workpiece-carrying platform is divided into a workpiece-carrying platform body forming an essential portion of a workpiece-carrying surface for mounting the substrate thereon and a lifting/lowering ring plate forming the remaining portion of the workpiece-carrying surface; and the lifting/lowering ring plate is combined with the workpiece-carrying platform body in a manner such that the lifting/lowering ring plate is lifted and lowered relative to the workpiece-carrying platform body by means of a lifting/lowering mechanism.

In this apparatus of the present invention, the workpiece-carrying surface of of the workpiece-carrying platform body is made flush with the corresponding workpiece-carrying surface of the lifting/lowering ring plate so as to form a surface (i.e., workpiece-carrying surface) of the workpiece-carrying platform, on which surface the substrate is mounted and subjected to heat treatment as is in the case of the conventional workpiece-carrying platform.

After completion of such heat treatment, in case that the substrate is separated from the workpiece-carrying platform, first, the lifting/lowering ring plate is lowered to separate the substrate from the workpiece-carrying surface of the lifting/lowering ring plate. Then, the lift pin is moved up to lift the substrate from the workpiece-carrying surface of the workpiece-carrying platform body. As described above, separation of the substrate from the workpiece-carrying surface is conducted in the two steps described above to reduce the contact area stepwise. Consequently, in comparison with cases where the entire surface of the substrate is separated from the workpiece-carrying surface at a time, it is possible for the apparatus of the present invention to reduce the amount of electrostatic charges built up at a time of the separation of the substrate from the workpiece-carrying surface.

According to a second aspect of the present invention, the above object of the present invention is accomplished by providing:

The apparatus for heat-treating the substrate, as set forth in the first aspect of the present invention, wherein:

a heater is incorporated in the lifting/lowering ring plate.

In this apparatus of the present invention, it is possible to enhance uniformity in temperature of the substrate in heating.

According to a third aspect of the present invention, the above object of the present invention is accomplished by providing:

The apparatus for heat-treating the substrate, as set forth in the first aspect of the present invention, wherein:

a fine irregularity is formed in the workpiece-carrying surface of the workpiece-carrying platform to reduce a contact area of the workpiece-carrying surface, through which contact area the workpiece-carrying surface is brought into contact with the substrate.

According to a fourth aspect of the present invention, the above object of the present invention is accomplished by providing:

The apparatus for heat-treating the substrate, as set forth in the second aspect of the present invention, wherein:

a fine irregularity is formed in the workpiece-carrying surface of the workpiece-carrying platform to reduce a contact area of the workpiece-carrying surface, through which contact area the workpiece-carrying surface is brought into contact with the substrate.

In the above apparatus according to each of the third and the fourth aspect of the present invention, since the fine irregularity is provided in the workpiece-carrying surface, it is possible to reduce the contact area of the substrate, through which contact area the substrate is brought into contact with the workpiece-carrying surface, whereby the amount of electrostatic charges due to the separation of the substrate from the workpiece-carrying surface is reduced.

According to a fifth aspect of the present invention, the above object of the present invention is accomplished by providing:

The apparatus for heat-treating the substrate, as set forth in the first aspect of the present invention, wherein:

the workpiece-carrying platform body of the workpiece-carrying platform is provided with a receiving groove; and the lifting/lowering ring plate is received in the receiving groove so as to be capable of being lifted and lowered.

According to a sixth aspect of the present invention, the above object of the present invention is accomplished by providing:

The apparatus for heat-treating the substrate, as set forth in the second aspect of the present invention, wherein:

the workpiece-carrying platform body of the workpiece-carrying platform is provided with a receiving groove; and the lifting/lowering ring plate is received in the receiving groove so as to be capable of being lifted and lowered.

According to a seventh aspect of the present invention, the above object of the present invention is accomplished by providing:

The apparatus for heat-treating the substrate, as set forth in the third aspect of the present invention, wherein:

the workpiece-carrying platform body of the workpiece-carrying platform is provided with a receiving groove; and the lifting/lowering ring plate is received in the receiving groove so as to be capable of being lifted and lowered.

In the apparatus according to each of the fifth, sixth and the seventh aspect of the present invention, since the lifting/lowering ring plate is received in the receiving groove, the receiving groove has its side walls act as guide means for stabilizing the lifting/lowering ring plate in up-and-down movement thereof.

According to an eighth aspect of the present invention, the above object of the present invention is accomplished by providing:

The apparatus for heat-treating the substrate, as set forth in the fifth aspect of the present invention, wherein:

provided in the receiving groove is a stopper means for stopping the lifting/lowering plate in a position where the workpiece-carrying surface of the lifting/lowering ring plate reaches the same level as that of the workpiece-carrying platform body.

In the apparatus according to the eighth aspect of the present invention, since the stopper is provided in the receiving groove, it is possible to have the workpiece-carrying surface of the lifting/lowering ring plate reach the same level as that of the workpiece-carrying platform body by lifting the lifting/lowering ring plate up to its lifting limit.

According to a ninth aspect of the present invention, the above object of the present invention is accomplished by providing:

The apparatus for heat-treating the substrate, as set forth in the first aspect of the present invention, wherein:

the lifting/lowering ring plate is constructed of a ring portion and four projections disposed around an outer peripheral portion of the ring portion, the four projections being spaced apart from each other at equal angular intervals of approximately 90 degrees;

whereby the lifting/lowering ring plate assumes a crossroads' traffic-rotary-like shape in plan view.

According to a tenth aspect of the present invention, the above object of the present invention is accomplished by providing:

The apparatus for heat-treating the substrate, as set forth in the second aspect of the present invention, wherein:

the lifting/lowering ring plate is constructed of a ring portion and four projections disposed around an outer peripheral portion of the ring portion, the four projections being spaced apart from each other at equal angular intervals of approximately 90 degrees;

whereby the lifting/lowering ring plate assumes a crossroads' traffic-rotary-like shape in plan view.

According to a eleventh aspect of the present invention, the above object of the present invention is accomplished by providing:

The apparatus for heat-treating the substrate, as set forth in the third aspect of the present invention, wherein:

the lifting/lowering ring plate is constructed of a ring portion and four projections disposed around an outer peripheral portion of the ring portion, the four projections being spaced apart from each other at equal angular intervals of approximately 90 degrees;

whereby the lifting/lowering ring plate assumes a crossroads' traffic-rotary-like shape in plan view.

According to a twelfth aspect of the present invention, the above object of the present invention is accomplished by providing:

The apparatus for heat-treating the substrate, as set forth in the fourth aspect of the present invention, wherein:

the lifting/lowering ring plate is constructed of a ring portion and four projections disposed around an outer peripheral portion of the ring portion, the four projections being spaced apart from each other at equal angular intervals of approximately 90 degrees;

whereby the lifting/lowering ring plate assumes a crossroads' traffic-rotary-like shape in plan view.

According to a thirteenth aspect of the present invention, the above object of the present invention is accomplished by providing:

The apparatus for heat-treating the substrate, as set forth in the fourth aspect of the present invention, wherein:

the lifting/lowering ring plate is constructed of a ring portion and four projections disposed around an outer peripheral portion of the ring portion, the four projections being spaced apart from each other at equal angular intervals of approximately 90 degrees;

whereby the lifting/lowering ring plate assumes a crossroads' traffic-rotary-like shape in plan view.

According to a fourteenth aspect of the present invention, the above object of the present invention is accomplished by providing:

The apparatus for heat-treating the substrate, as set forth in the first aspect of the present invention, wherein:

each of the workpiece-carrying platform body and the lifting/lowering ring plate of the workpiece-carrying platform is provided with a vacuum suction hole and an air blow hole.

According to a fifteenth aspect of the present invention, the above object of the present invention is accomplished by providing:

The apparatus for heat-treating the substrate, as set forth in the second aspect of the present invention, wherein:

each of the workpiece-carrying platform body and the lifting/lowering ring plate of the workpiece-carrying platform is provided with a vacuum suction hole and an air blow hole.

According to a sixteenth aspect of the present invention, the above object of the present invention is accomplished by providing:

The apparatus for heat-treating the substrate, as set forth in the third aspect of the present invention, wherein:

each of the workpiece-carrying platform body and the lifting/lowering ring plate of the workpiece-carrying platform is provided with a vacuum suction hole and an air blow hole.

According to a seventeenth aspect of the present invention, the above object of the present invention is accomplished by providing:

The apparatus for heat-treating the substrate, as set forth in the fourth aspect of the present invention, wherein:

each of the workpiece-carrying platform body and the lifting/lowering ring plate of the workpiece-carrying platform is provided with a vacuum suction hole and an air blow hole.

According to an eighteenth aspect of the present invention, the above object of the present invention is accomplished by providing:

The apparatus for heat-treating the substrate, as set forth in the fifth aspect of the present invention, wherein:

each of the workpiece-carrying platform body and the lifting/lowering ring plate of the workpiece-carrying platform is provided with a vacuum suction hole and an air blow hole.

According to a nineteenth aspect of the present invention, the above object of the present invention is accomplished by providing:

The apparatus for heat-treating the substrate, as set forth in the sixth aspect of the present invention, wherein:

each of the workpiece-carrying platform body and the lifting/lowering ring plate of the workpiece-carrying platform is provided with a vacuum suction hole and an air blow hole. In this case, it is possible to form the vacuum suction hole and the air blow hole separately from each other. It is also possible to use a predetermined hole as each of the vacuum suction hole and the air blow hole, provided that the predetermined hole is connected with a suitable switching valve and like means for switching the predetermined hole from the vacuum suction hole to the air blow hole and vice versa.

In the apparatus according to each of the fourteenth to nineteenth aspects of the present invention, the substrate is vacuum-sucked by the vacuum suction hole, and is brought into close contact with the workpiece-carrying platform in mounting the substrate thereon, which realizes the uniformity of heating and the improvement in efficiency of the apparatus of the present invention. Further, by driving a current of air through the air blow hole, it is possible to enhance the separation of the substrate from the workpiece-carrying platform.

Particularly, since the apparatus of the present invention is provided with both the vacuum suction hole and the air blow hole in each of the workpiece-carrying platform body and the lifting/lowering ring plate, it is possible to drive the current of air through the air blow hole in the lifting/lowering ring plate in a condition in which the vacuum suction is carried out though the vacuum suction hole in the workpiece-carrying platform body, which enables the substrate to be smoothly separated from the lifting/lowering ring plate.

According to a twentieth aspect of the present invention, the above object of the present invention is accomplished by providing:

A method for separating a substrate from an apparatus for heat-treating the substrate, by lifting the substrate on the apparatus, the apparatus comprising: a workpiece-carrying platform for mounting the substrate thereon; a heater element for supplying heat to the substrate on the workpiece-carrying platform through the workpiece-carrying platform; and, a lift pin for lifting the substrate on the workpiece-carrying platform, the lift pin being extended upward from its retracted position disposed inside the workpiece-carrying platform when the substrate is transferred; wherein: the workpiece-carrying platform is divided into a workpiece-carrying platform body forming an essential portion of a workpiece-carrying surface for mounting the substrate thereon and a lifting/lowering ring plate forming the remaining portion of the workpiece-carrying surface; and, the lifting/lowering ring plate is combined with the workpiece-carrying platform body in a manner such that the lifting/lowering ring plate is lifted and lowered relative to the workpiece-carrying platform body by means of a lifting/lowering mechanism, the method comprising the steps of:

lowering the lifting/lowering ring plate of the workpiece-carrying platform in a condition in which the substrate is mounted on the workpiece-carrying platform, so that the substrate is separated from the workpiece-carrying surface of the lifting/lowering ring plate; and lifting the lift pin to separate and lift the substrate from the workpiece-carrying surface of the workpiece-carrying platform body of the workpiece-carrying platform.

In this method of the present invention, first the lifting/lowering ring plate is lowered, and then the lift pins are lifted to lift the substrate from the workpiece-carrying platform body. Consequently, the separation of the substrate from the workpiece-carrying surface is carried out in two steps, which makes it possible to reduce stepwise the contact area between the substrate and the workpiece-carrying surface. Therefore, in comparison with cases where the entire area of the substrate is separated from the workpiece-carrying surface at a time, it is possible for the method of the present invention to reduce the amount of electrostatic charges built up at a time of the separation of the substrate from the workpiece-carrying surface.

According to a twenty-first aspect of the present invention, the above object of the present invention is accomplished by providing:

The method for separating the substrate from the apparatus for heat-treating the substrate, as set forth in the twentieth aspect of the present invention, wherein:

a heater is incorporated in the lifting/lowering ring plate.

According to a twenty-second aspect of the present invention, the above object of the present invention is accomplished by providing:

The method for separating the substrate from the apparatus for heat-treating the substrate, as set forth in the twentieth aspect of the present invention, wherein:

a fine irregularity is formed in the workpiece-carrying surface of the workpiece-carrying platform to reduce a contact area of the workpiece-carrying surface, through which contact area the workpiece-carrying surface is brought into contact with the substrate.

According to a twenty-third aspect of the present invention, the above object of the present invention is accomplished by providing:

The method for separating the substrate from the apparatus for heat-treating the substrate, as set forth in the twentieth aspect of the present invention, wherein:

a heater is incorporated in the lifting/lowering ring plate; and a fine irregularity is formed in the workpiece-carrying surface of the workpiece-carrying platform to reduce a contact area of the workpiece-carrying surface, through which contact area the workpiece-carrying surface is brought into contact with the substrate.

According to a twenty-fourth aspect of the present invention, the above object of the present invention is accomplished by providing:

The method for separating the substrate from the apparatus for heat-treating the substrate, as set forth in the twentieth aspect of the present invention, wherein:

the workpiece-carrying platform body of the workpiece-carrying platform is provided with a receiving groove; and the lifting/lowering ring plate is received in the receiving groove so as to be capable of being lifted and lowered.

According to a twenty-fifth aspect of the present invention, the above object of the present invention is accomplished by providing:

The method for separating the substrate from the apparatus for heat-treating the substrate, as set forth in the twentieth aspect of the present invention, wherein:

a heater is incorporated in the lifting/lowering ring plate; and the workpiece-carrying platform body of the workpiece-carrying platform is provided with a receiving groove; and the lifting/lowering ring plate is received in the receiving groove so as to be capable of being lifted and lowered.

According to a twenty-sixth aspect of the present invention, the above object of the present invention is accomplished by providing:

The method for separating the substrate from the apparatus for heat-treating the substrate, as set forth in the twentieth aspect of the present invention, wherein:

a fine irregularity is formed in the workpiece-carrying surface of the workpiece-carrying platform to reduce a contact area of the workpiece-carrying surface, through which contact area the workpiece-carrying surface is brought into contact with the substrate;

the workpiece-carrying platform body of the workpiece-carrying platform is provided with a receiving groove; and the lifting/lowering ring plate is received in the receiving groove so as to be capable of being lifted and lowered.

According to a twenty-seventh aspect of the present invention, the above object of the present invention is accomplished by providing:

The method for separating the substrate from the apparatus for heat-treating the substrate, as set forth in the twentieth aspect of the present invention, wherein:

the workpiece-carrying platform body of the workpiece-carrying platform is provided with a receiving groove;

the lifting/lowering ring plate is received in the receiving groove so as to be capable of being lifted and lowered;

provided in the receiving groove is a stopper means for stopping the lifting/lowering plate in a position where the workpiece-carrying surface of the lifting/lowering ring plate reaches the same level as that of the workpiece-carrying platform body.

According to a twenty-eighth aspect of the present invention, the above object of the present invention is accomplished by providing:

The method for separating the substrate from the apparatus for heat-treating the substrate, as set forth in the twentieth aspect of the present invention, wherein:

the lifting/lowering ring plate is constructed of a ring portion and four projections disposed around an outer peripheral portion of the ring portion, the four projections being spaced apart from each other at equal angular intervals of approximately 90 degrees;

whereby the lifting/lowering ring plate assumes a crossroads' traffic-rotary-like shape in plan view.

According to a twenty-ninth aspect of the present invention, the above object of the present invention is accomplished by providing:

The method for separating the substrate from the apparatus for heat-treating the substrate, as set forth in the twentieth aspect of the present invention, wherein:

a heater is incorporated in the lifting/lowering ring plate;

the lifting/lowering ring plate is constructed of a ring portion and four projections disposed around an outer peripheral portion of the ring portion, the four projections being spaced apart from each other at equal angular intervals of approximately 90 degrees;

whereby the lifting/lowering ring plate assumes a crossroads' traffic-rotary-like shape in plan view.

According to a thirtieth aspect of the present invention, the above object of the present invention is accomplished by providing:

The method for separating the substrate from the apparatus for heat-treating the substrate, as set forth in the twentieth aspect of the present invention, wherein:

a fine irregularity is formed in the workpiece-carrying surface of the workpiece-carrying platform to reduce a contact area of the workpiece-carrying surface, through which contact area the workpiece-carrying surface is brought into contact with the substrate;

the lifting/lowering ring plate is constructed of a ring portion and four projections disposed around an outer peripheral portion of the ring portion, the four projections being spaced apart from each other at equal angular intervals of approximately 90 degrees;

whereby the lifting/lowering ring plate assumes a crossroads' traffic-rotary-like shape in plan view.

According to a thirty-first aspect of the present invention, the above object of the present invention is accomplished by providing:

The method for separating the substrate from the apparatus for heat-treating the substrate, as set forth in the twentieth aspect of the present invention, wherein:

the workpiece-carrying platform body of the workpiece-carrying platform is provided with a receiving groove;

the lifting/lowering ring plate is received in the receiving groove so as to be capable of being lifted and lowered;

the lifting/lowering ring plate is constructed of a ring portion and four projections disposed around an outer peripheral portion of the ring portion, the four projections being spaced apart from each other at equal angular intervals of approximately 90 degrees;

whereby the lifting/lowering ring plate assumes a crossroads' traffic-rotary-like shape in plan view.

According to a thirty-second aspect of the present invention, the above object of the present invention is accomplished by providing:

The method for separating the substrate from the apparatus for heat-treating the substrate, as set forth in the twentieth aspect of the present invention, wherein:

provided in the receiving groove is a stopper means for stopping the lifting/lowering plate in a position where the workpiece-carrying surface of the lifting/lowering ring plate reaches the same level as that of the workpiece-carrying platform body;

the lifting/lowering ring plate is constructed of a ring portion and four projections disposed around an outer peripheral portion of the ring portion, the four projections being spaced apart from each other at equal angular intervals of approximately 90 degrees;

whereby the lifting/lowering ring plate assumes a crossroads' traffic-rotary-like shape in plan view.

According to a thirty-third aspect of the present invention, the above object of the present invention is accomplished by providing:

The method for separating the substrate from the apparatus for heat-treating the substrate, as set forth in the twentieth aspect of the present invention, wherein:

each of the workpiece-carrying platform body and the lifting/lowering ring plate of the workpiece-carrying platform is provided with a vacuum suction hole and an air blow hole.

According to a thirty-fourth aspect of the present invention, the above object of the present invention is accomplished by providing:

The method for separating the substrate from the apparatus for heat-treating the substrate, as set forth in the twentieth aspect of the present invention, wherein:

a heater is incorporated in the lifting/lowering ring plate;

each of the workpiece-carrying platform body and the lifting/lowering ring plate of the workpiece-carrying platform is provided with a vacuum suction hole and an air blow hole.

According to a thirty-fifth aspect of the present invention, the above object of the present invention is accomplished by providing:

The method for separating the substrate from the apparatus for heat-treating the substrate, as set forth in the twentieth aspect of the present invention, wherein:

a fine irregularity is formed in the workpiece-carrying surface of the workpiece-carrying platform to reduce a contact area of the workpiece-carrying surface, through which contact area the workpiece-carrying surface is brought into contact with the substrate;

each of the workpiece-carrying platform body and the lifting/lowering ring plate of the workpiece-carrying platform is provided with a vacuum suction hole and an air blow hole.

According to a thirty-sixth aspect of the present invention, the above object of the present invention is accomplished by providing:

The method for separating the substrate from the apparatus for heat-treating the substrate, as set forth in the twentieth aspect of the present invention, wherein:

the workpiece-carrying platform body of the workpiece-carrying platform is provided with a receiving groove;

the lifting/lowering ring plate is received in the receiving groove so as to be capable of being lifted and lowered;

each of the workpiece-carrying platform body and the lifting/lowering ring plate of the workpiece-carrying platform is provided with a vacuum suction hole and an air blow hole.

According to a thirty-seventh aspect of the present invention, the above object of the present invention is accomplished by providing:

The method for separating the substrate from the apparatus for heat-treating the substrate, as set forth in the twentieth aspect of the present invention, wherein:

the lifting/lowering ring plate is received in the receiving groove so as to be capable of being lifted and lowered;

provided in the receiving groove is a stopper means for stopping the lifting/lowering plate in a position where the workpiece-carrying surface of the lifting/lowering ring plate reaches the same level as that of the workpiece-carrying platform body; and each of the workpiece-carrying platform body and the lifting/lowering ring plate of the workpiece-carrying platform is provided with a vacuum suction hole and an air blow hole.

According to a thirty-eighth aspect of the present invention, the above object of the present invention is accomplished by providing:

The method for separating the substrate from the apparatus for heat-treating the substrate, as set forth in the twentieth aspect of the present invention, wherein:

the lifting/lowering ring plate is constructed of a ring portion and four projections disposed around an outer peripheral portion of the ring portion, the four projections being spaced apart from each other at equal angular intervals of approximately 90 degrees; and each of the workpiece-carrying platform body and the lifting/lowering ring plate of the workpiece-carrying platform is provided with a vacuum suction hole and an air blow hole.

In the above method according to any one of the twentieth to thirty-eighth aspects of the present invention, first the lifting/lowering ring plate is lowered, and then the lift pins are lifted to lift the substrate from the workpiece-carrying platform body. Consequently, the separation of the substrate from the workpiece-carrying surface is carried out in two steps, which makes it possible to reduce the contact area between the substrate and the workpiece-carrying surface stepwise. Therefore, in comparison with cases where the entire area of the substrate is separated from the workpiece-carrying surface at a time, it is possible for the above method of the present invention to reduce the amount of electrostatic charges built up when the substrate is separated.

According to a thirty-ninth aspect of the present invention, the above object of the present invention is accomplished by providing:

In an apparatus for heat-treating a substrate comprising: a workpiece-carrying platform for mounting the substrate thereon; and, a heater element for supplying heat to the substrate on the workpiece-carrying platform through the workpiece-carrying platform; the improvement wherein:

the workpiece-carrying platform is divided into a workpiece-carrying platform body forming an essential portion of a workpiece-carrying surface for mounting the substrate thereon and a lifting/lowering ring plate forming the remaining portion of the workpiece-carrying surface; and the apparatus further comprises a lifting/lowering drive mechanism for lifting and lowering the lifting/lowering ring plate relative to the workpiece-carrying surface of the workpiece-carrying platform body to separate the substrate from the workpiece-carrying surface of the workpiece-carrying platform body.

In this apparatus of the present invention, by having the workpiece-carrying surface of the workpiece-carrying platform body be flush with the corresponding workpiece-carrying surface of the lifting/lowering ring plate, it is possible to to form a plane (i.e., workpiede-carrying surface of the workpiece-carrying platform for carrying the substrate thereon). By mounting the substrate on the above plane, it is possible to carry out the heat treatment of the substrate as is in the conventional workpiece-carrying platform. After completion of such heat treatment, when the substrate is separated from the workpiece-carrying platform, the lifting/lowering ring plate is lifted to lift the substrate from the workpiece-carrying platform body. Consequently, in this case, the lifting/lowering ring plate of the apparatus of the present invention serves as the conventional lift pins. At this time, the workpiece-carrying surface carrying the substrate is shared by both the lifting/lowering ring plate and the workpiece-carrying platform body. Consequently, when the lifting/lowering ring plate is lifted, part of the contact area of the substrate with the workpiece-carrying surface falling to the workpiece-carrying platform body's share is separated from the workpiece-carrying platform body. Then, when the substrate still resting on the lifting/lowering ring plate is further lifted from the lifting/lowering ring plate, the remaining part of the contact surface of the substrate is separated from the workpiece-carrying surface falling to the lifting/lowering ring plate's share. As is clear from the above, it is possible for the apparatus of the present invention to reduce the contact area of the substrate stepwise.

Consequently, in comparison with the conventional case where the entire surface of the substrate is separated from the workpiece-carrying surface at a time, it is possible for the present invention to reduce the amount of electrostatic charges built up at a time when the substrate is separated from the workpiece-carrying surface.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Now, the present invention will be described in detail with reference to the accompanying drawings, which show essential parts in construction of the apparatus of the present invention for heat-treating the substrate and its operation according to the embodiments of the present invention.

More particularly, embodiments of the present invention in which an apparatus of the present invention for heat-treating a substrate is applied to a resist coating phenomenon system for an LCD substrate will be described.

Figure 6:
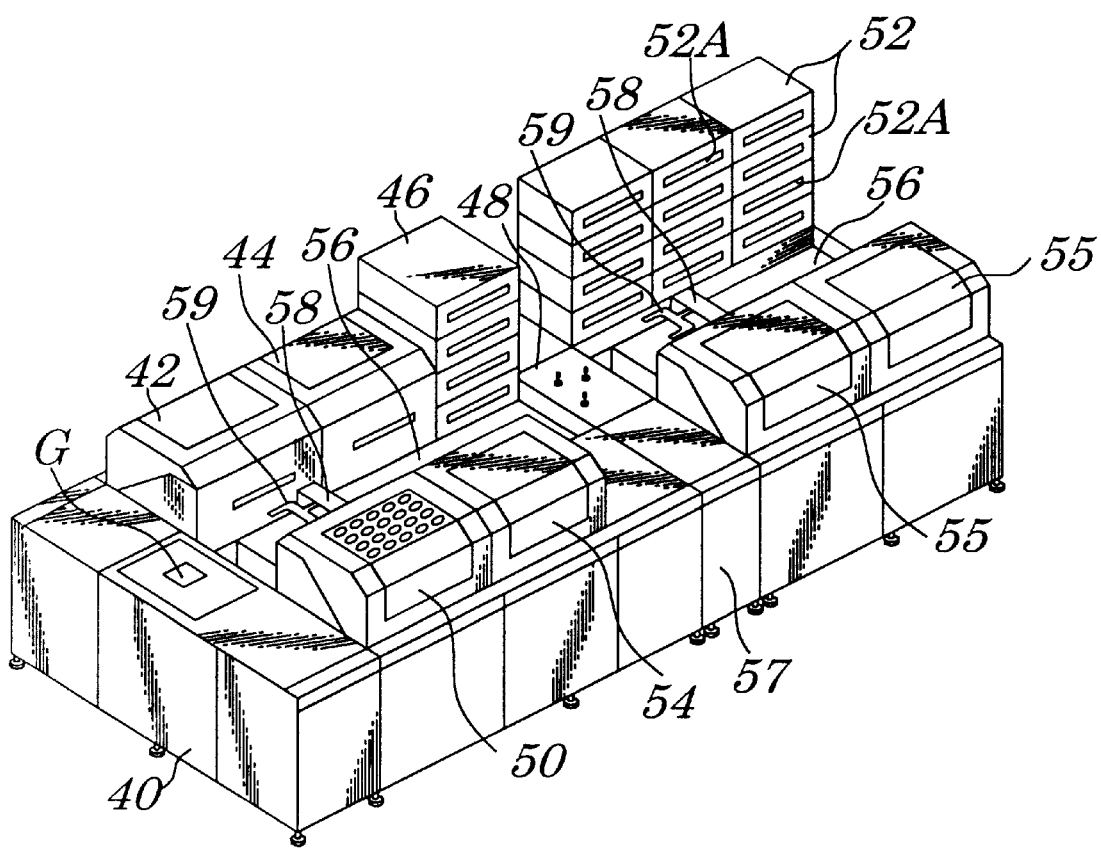
FIG. 6 is a schematic perspective view of a processing system comprising the apparatus of the present invention for heat-treating the substrate.
Figure 7:
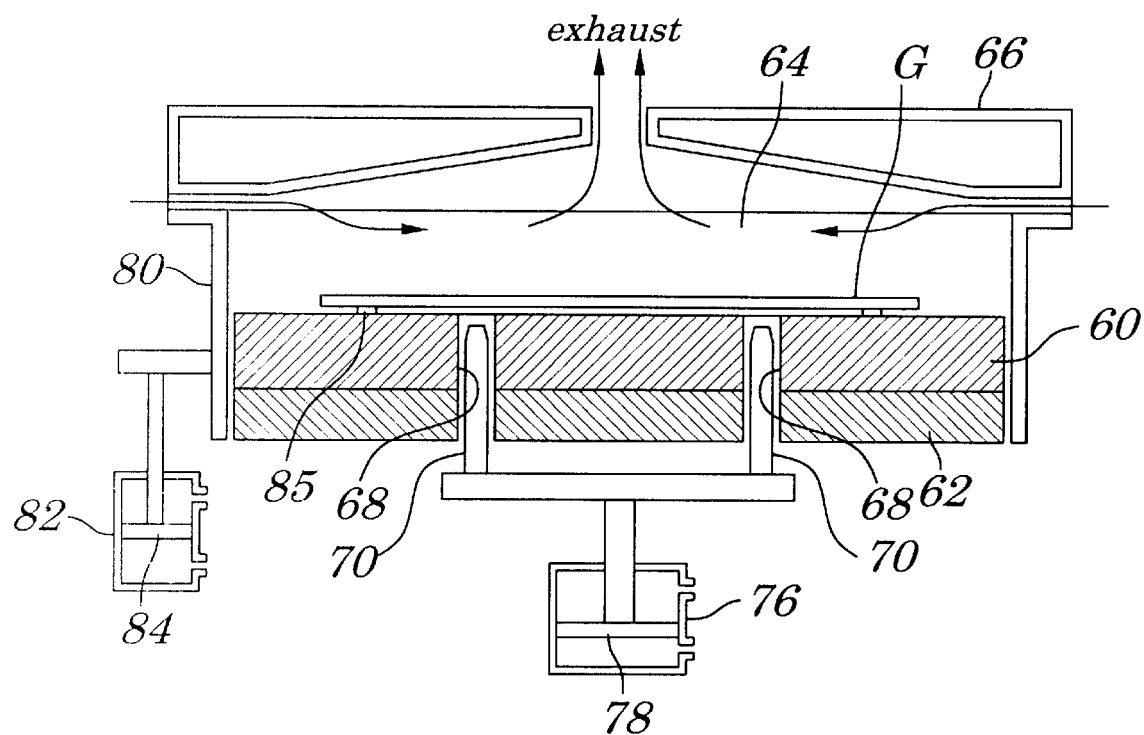
FIG. 7 is a side view of the conventional apparatus for heat-treating the substrate.
Figure 8:
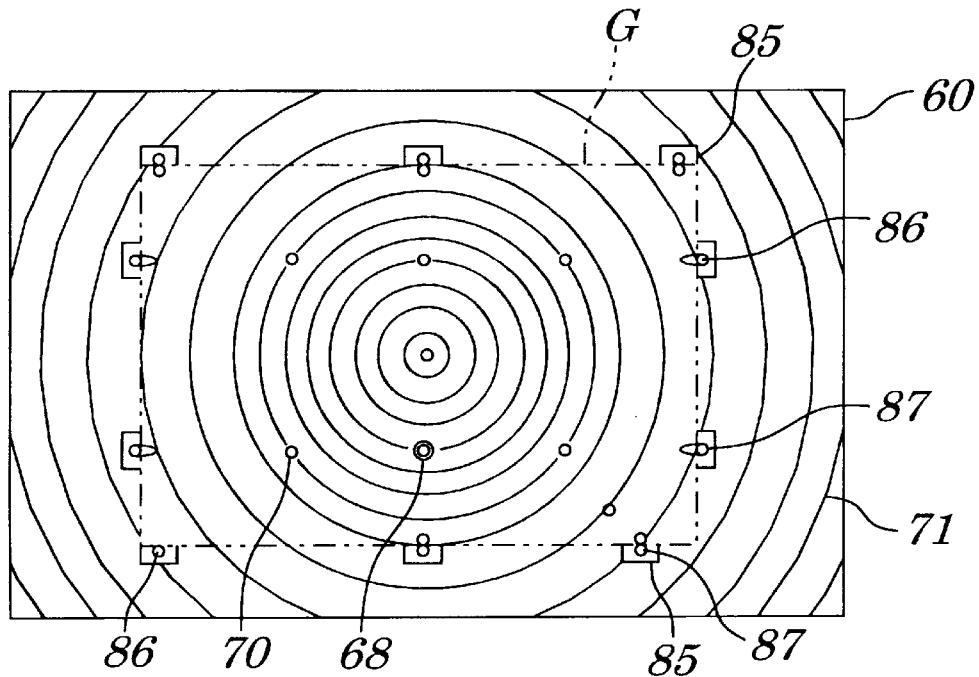
FIG. 8 is a plan view of an essential part of the conventional apparatus for heat-treating the substrate.
Figure 9:
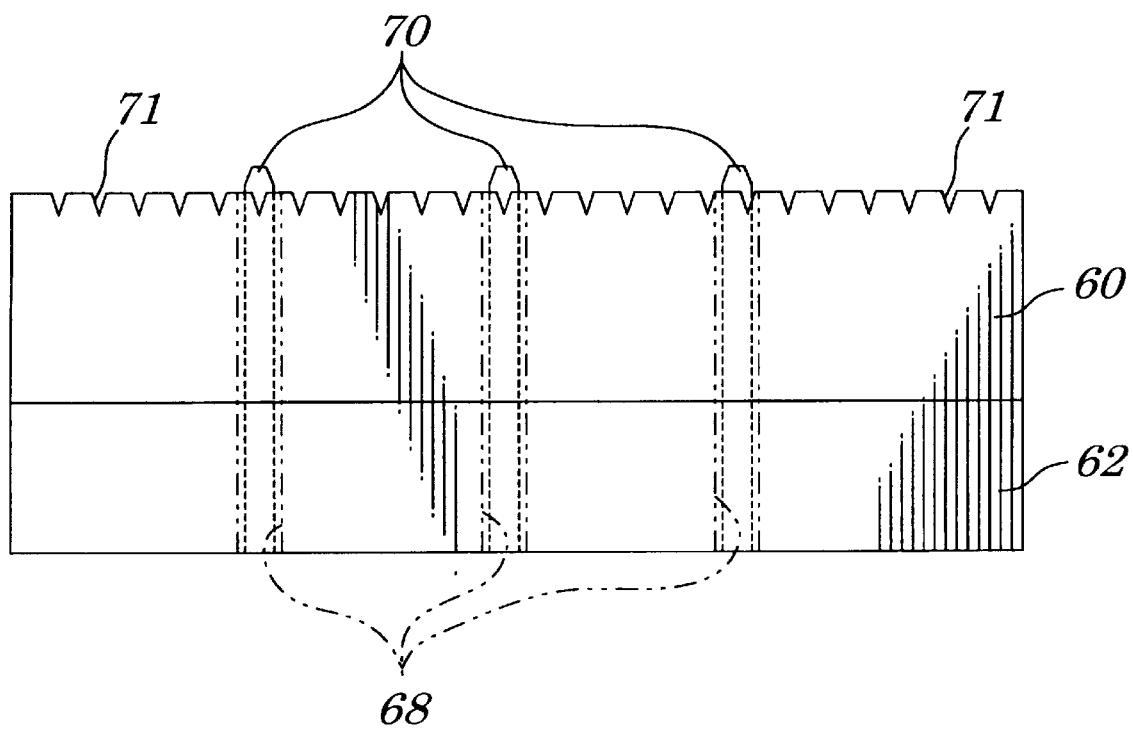
FIG. 9 is a side view of the essential part of the conventional apparatus for heat-treating the substrate.

First, with reference to FIG. 6, the entire system to which the present invention is applied will be outlined.

As shown in FIG. 6, this system comprises: loader portion 40 for loading and unloading a substrate "G" as a workpiece; a brush washing unit 42 for the substrate "G"; a jet water washing unit 44 for washing the substrate "G" with a jet of high-pressure water; an adhesion treatment unit 46 for having the surface of the substrate "G" be hydrophobic; a cooling treatment unit 48 for cooling the substrate "G" to a predetermined temperature; a resist applying unit 50 for coating the surface of the substrate "G" with a resist liquid; a heat treatment unit 52 for performing a pre- or a post-baking operation of the substrate "G" by heating the substrate "G" before or after the application of the resist liquid to the surface of the substrate "G"; a resist removing unit 54 for removing the resist disposed on a peripheral portion of the substrate "G"; and, a developing unit 55.

In a central area of the above system, there is provided a substrate conveyor passage 56 extending in a longitudinal direction of the system. This substrate conveyor passage 56 is divided by a central extension portion 57. The individual units 40 to 54 described above are arranged so as to face the substrate conveyor passage 56. A plurality of substrate conveyor mechanisms 58 each for transferring the substrate "G" between adjacent ones of these units 40 to 54 are provided along the substrate conveyor passage 56 so as to be movable in parallel to the substrate conveyor passage 56.

The substrate conveyor mechanism 58 is provided with an arm 59 which holds the substrate "G" by using vacuum suction. Incidentally, the heat treatment unit 52 is provided with an opening portion 52A which faces the substrate conveyor passage 56. A plurality of such heat treatment units 52 are stacked to form a block, a plurality of which blocks are disposed side by side in parallel to each other.

Next, with reference to FIGS. 1(a) to 5, the apparatus of the present invention for heat-treating the substrate "G", which apparatus is used as the heat treatment unit 52 described above, will be described in detail.

As shown in FIGS. 1(a), 1(b), 1(c) and 5, the apparatus of the present invention for heat-treating the substrate "G" comprises: a workpiece-carrying platform 1 on which the substrate "G" is carried or mounted; a heater element 2 for supplying heat to the substrate "G" on the workpiece-carrying platform 1, through the platform 1; and, a plurality of lift pins 8 for lifting up the substrate "G" on the workpiece-carrying platform 1 by lifting up from their retracted positions located inside the workpiece-carrying platform 1 when the the substrate "G" is transferred.

The workpiece-carrying platform 1 is made of aluminum alloy excellent in heat conductivity, and mounted on the heater element 2 in a manner such that the workpiece-carrying platform 1 has its lower surface brought into close contact with an upper surface of the heater element 2. The heater element 2 is made of the same aluminum alloy as that of the workpiece-carrying platform 1, and has a heater (not shown) embedded therein in construction. Incidentally, in mounting the workpiece-carrying platform 1 on the heater element 2, it is preferable to apply a suitable material such silicone greases and the like excellent in heat conductivity to the lower surface of the workpiece-carrying platform 1 in improving the workpiece-carrying platform 1 in heat conductivity.

This workpiece-carrying platform 1 is divided into: a workpiece-carrying platform body 3 forming a major part (which assumes a value of from 30 to 70% of the entire area of a workpiece-carrying surface) of the workpiece-carrying surface for carrying the substrate "G" thereon; and, a lifting/lowering ring plate 4 forming the remaining part (which assumes a value of from 70 to 30% of the entire area of the workpiece-carrying surface) of the workpiece-carrying surface for carrying the substrate "G" thereon. The lifting/lowering ring plate 4 is received in a receiving groove 5 of the workpiece-carrying platform body 3 in a manner such that the lifting/lowering ring plate 4 is capable of being lifted and lowered in the receiving groove 5.

The lifting/lowering ring plate 4 is constructed of: a ring portion 4a; and, four projections 4b disposed around an outer peripheral portion of the ring portion 4a. These four projections 4b are spaced apart from each other at equal angular intervals of approximately 90 degrees, whereby the lifting/lowering ring plate 4 assumes a crossroads' traffic-rotary-like shape in plan view. The receiving groove 5 assumes substantially the same shape as that of the lifting/lowering ring plate 4, and is provided with: a ring groove portion 5a in which the ring portion 4a is received; and, four linear groove portions 5b in which the four projections 4b are received.

The lifting/lowering ring plate 4 is fitted in the interior of the receiving groove 5 substantially without any clearance. In the above condition, the lifting/lowering ring plate 4 is arranged so as to be capable of being slightly lifted and lowered to the same extent as that of the depth of the receiving groove 5. In this case, the lifting/lowering ring plate 4 is guided in its up-and-down movement through a sliding contact of its outer surface with an inner surface of the receiving groove 5.

Figure 1:
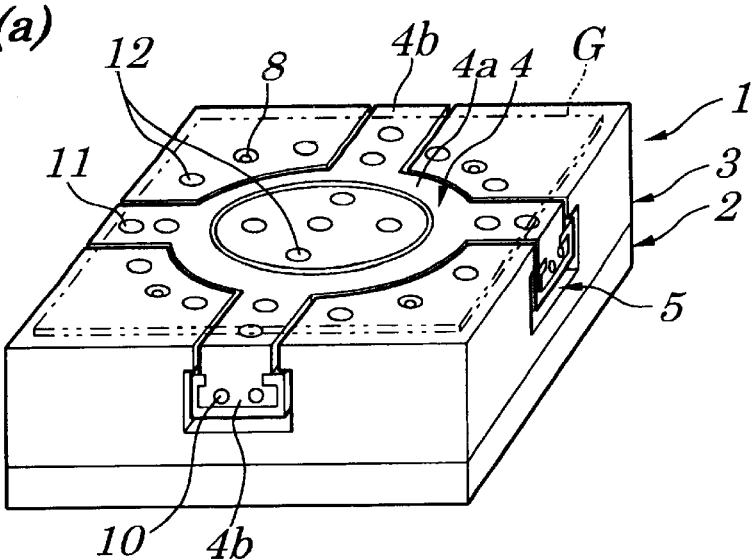
FIG. 1(a) is a perspective view of the workpiece-carrying platform of the apparatus of the present invention, illustrating the substrate mounted thereon.
FIG. 1(b) is a perspective view of the workpiece-carrying platform shown in FIG. 1(a) in a condition in which the lifting/lowering ring plate is lowered.
FIG. 1(c) is a perspective view of the workpiece-carrying platform shown in FIG. 1(a) in a condition in which the lift pins are lifted to lift the substrate from the workpiece-carrying platform.
Figure 1:
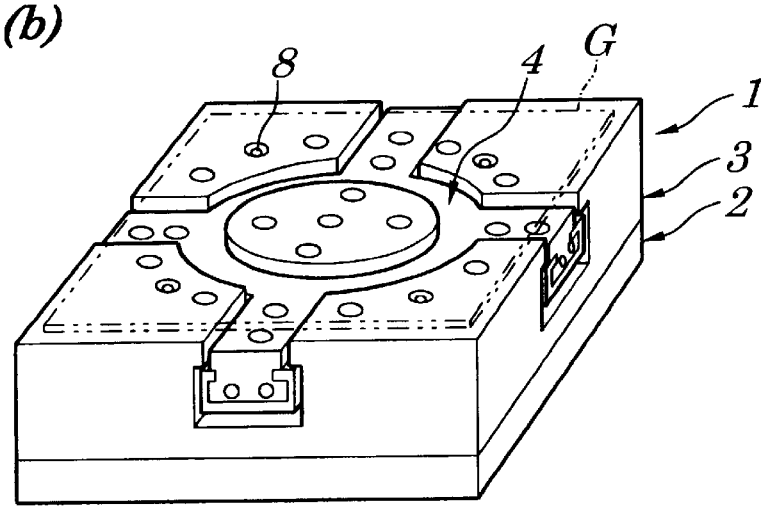
Figure 1:
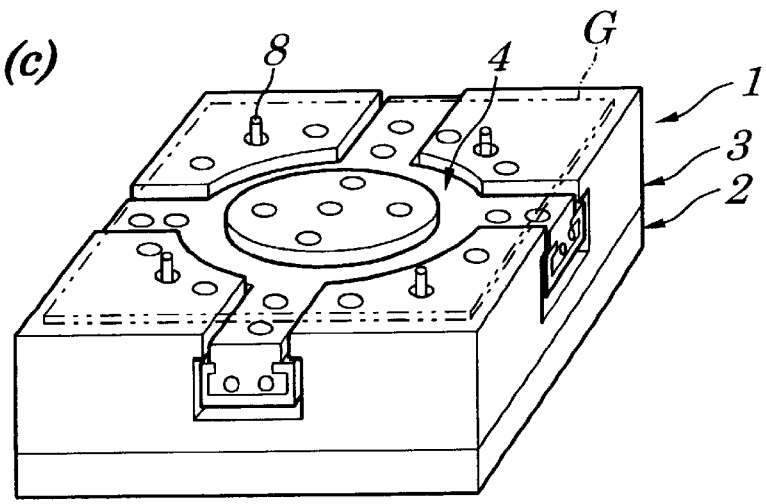
Figure 2:
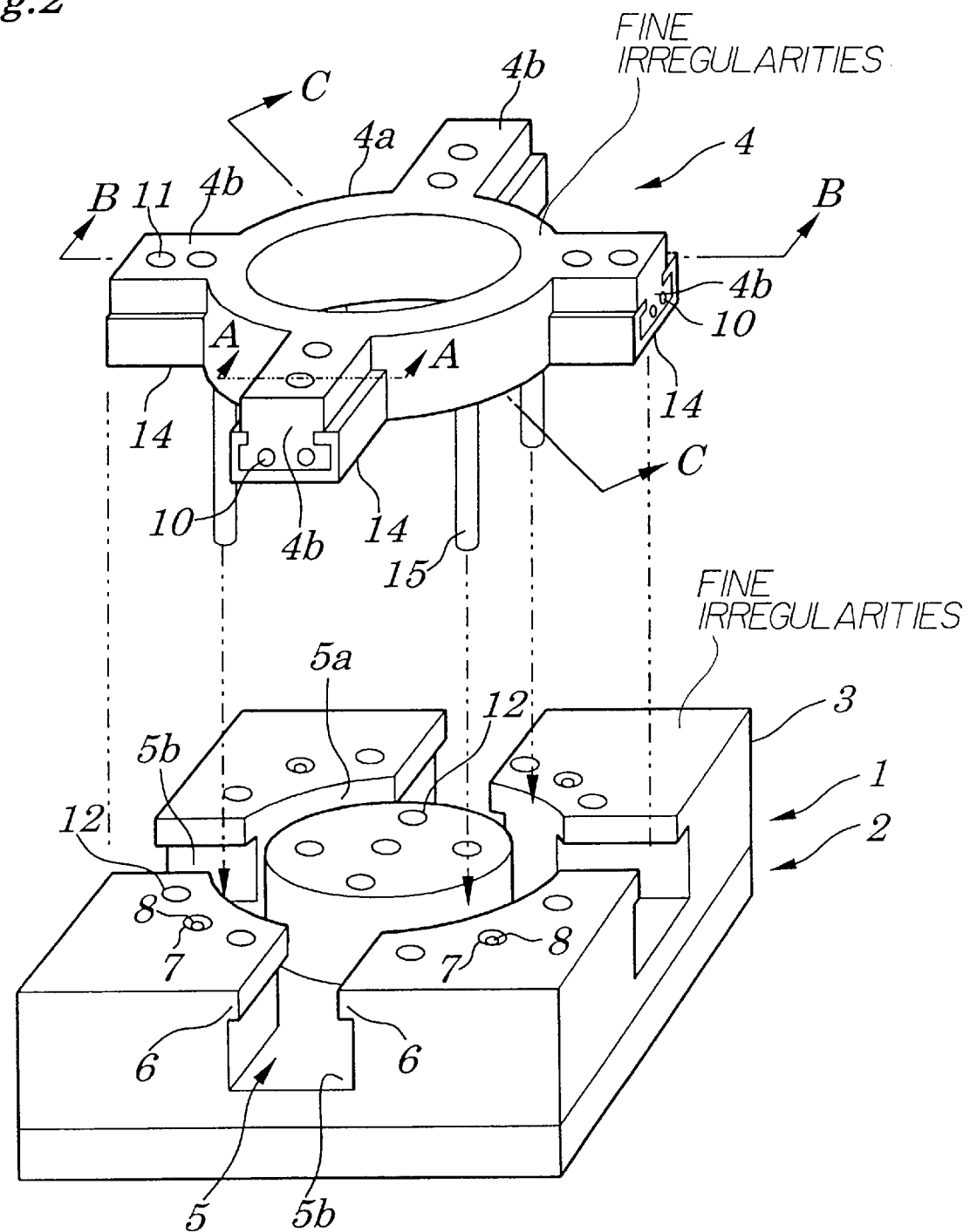
FIG. 2 is an exploded perspective view of the apparatus of the present invention for heat-treating the substrate shown in FIG. 1(a)
Figure 3:
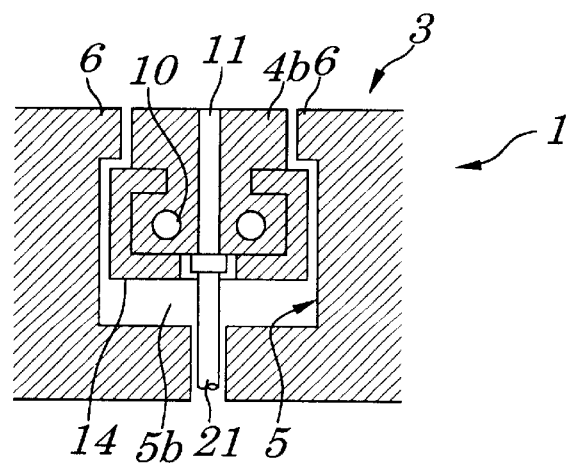
FIG. 3(a) is a cross-sectional view of the apparatus of the present invention for heat-treating the substrate, taken along the line A—A of FIG. 2.
FIG. 3(b) is a cross-sectional view of the apparatus of the present invention for heat-treating the substrate, taken along the line B—B of FIG. 2.
FIG. 3(c) is a cross-sectional view of the apparatus of the present invention for heat-treating the substrate, taken along the line C—C of FIG. 2.
Figure 3:
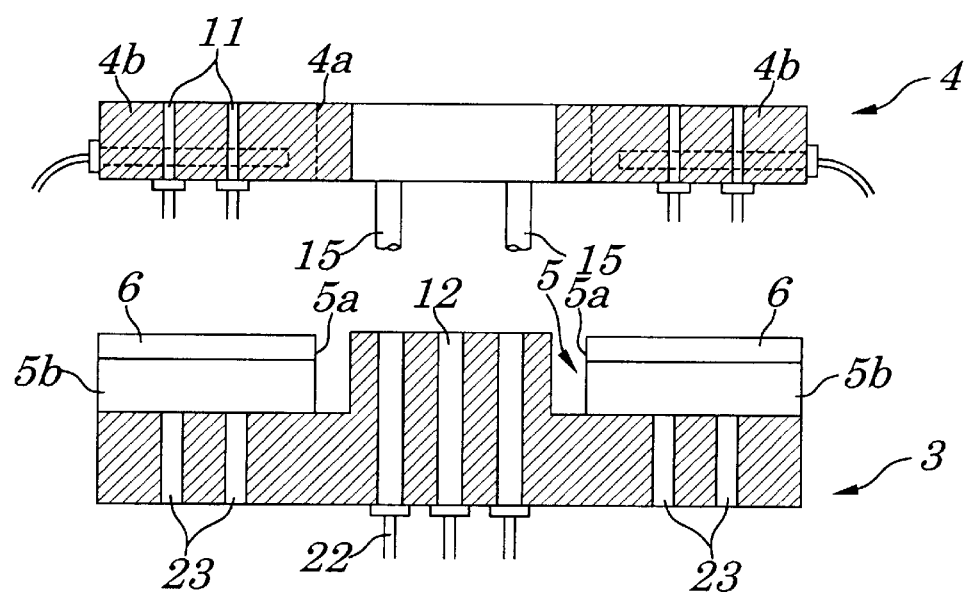
Figure 3:
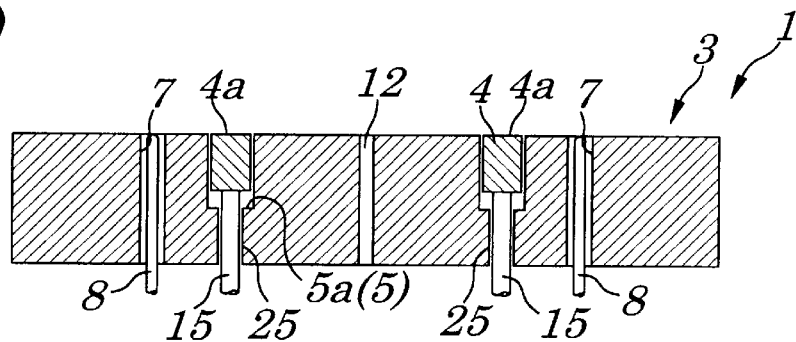
Figure 4:
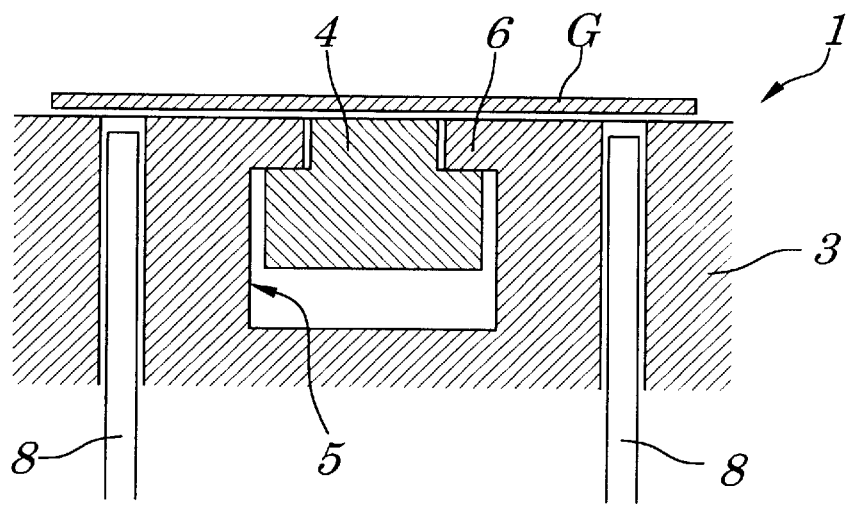
FIG. 4(a) is a cross-sectional view of the workpiece-carrying platform shown in FIG. 1(a), illustrating its operation in essential parts thereof.
FIG. 4(b) is a cross-sectional view of the workpiece-carrying platform shown in FIG. 1(b), illustrating its operation in essential parts thereof.
FIG. 4(c) is a cross-sectional view of the workpiece-carrying platform shown in FIG. 1(c), illustrating its operation in essential parts thereof.
Figure 4:
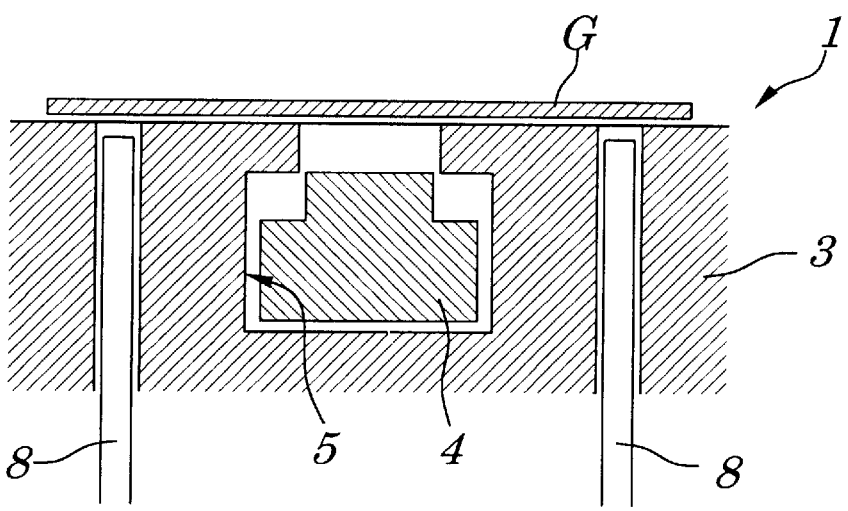
Figure 4:
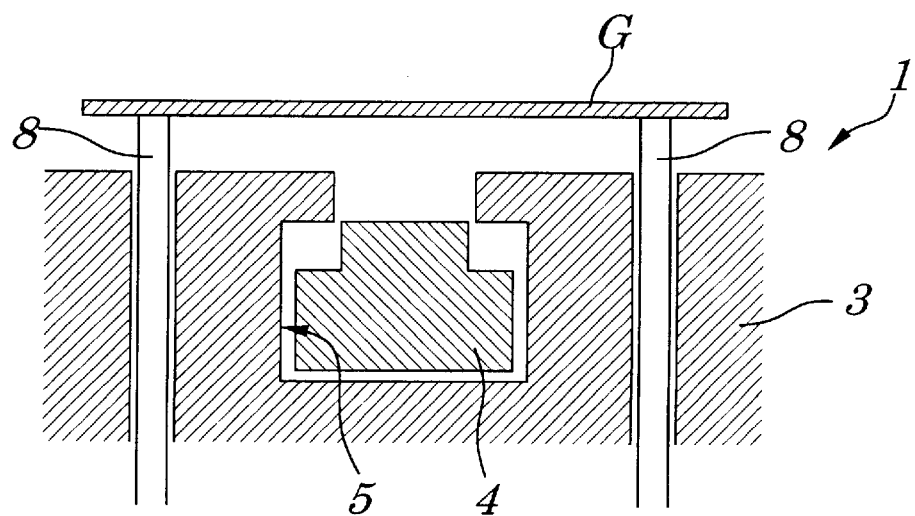
Figure 5:
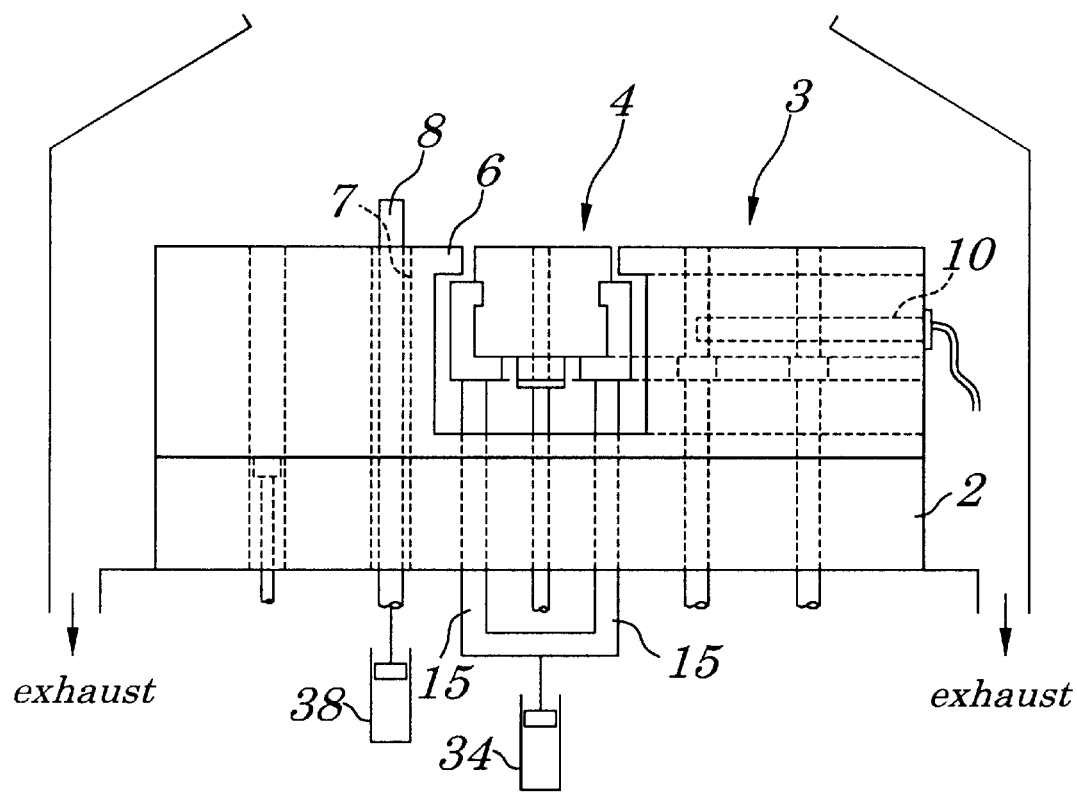
FIG. 5 is a side view of the apparatus of the present invention for heat-treating the substrate, illustrating a schematic entire construction of the apparatus.

As shown in FIGS. 2 to 3(c), the linear groove portion 5b of the receiving groove 5 is provided with a pair of stoppers 6 in its upper opening end portions in a manner such that these stoppers 6 are oppositely disposed from each other and provided in an inwardly protruding manner so as to stop the lifting/lowering ring plate 4 in its lifting movement at a position where the workpiece-carrying surface of the lifting/lowering ring plate 4 is flush with that of the workpiece-carrying platform body 3.

The reason why the workpiece-carrying surface of the lifting/lowering ring plate 4 is made flush with that of the workpiece-carrying platform body 3 is that it is necessary to improve the workpiece-carrying surface in heat conductivity with the substrate "G". The projection 4b of the lifting/lowering ring plate 4 assumes in cross section a convex shape so as to engage with the stoppers 6.

In this case, in order to insert the lifting/lowering ring plate 4 into the receiving groove 5 in which each of the stoppers 6 are provided in a protruding manner, each of the projections 4b of the lifting/lowering ring plate 4 assumes in cross section a convex shape in which another member 14 is mounted on a lower end portion of the projection 4b in an insertion manner, as shown in FIG. 3(a).

Incorporated in the projection 4b of the lifting/lowering ring plate 4 is a heater 10 which is inserted into the projection 4b from its end surface. This heater 10 always keeps the lifting/lowering ring plate 4 at the same temperature as that of the workpiece-carrying platform body 3 with temperature variations of ±2° C. Further, provided in a lower portion of the lifting/lowering ring plate 4 are a plurality of lifting/lowering support columns 15. Each of the lifting/lowering support columns 15 passes through a through-hole 25 in a bottom portion of the receiving groove 5 of the workpiece-carrying platform body 3, and is connected with a lifting/lowering drive mechanism 34 (see FIG. 5) which is disposed under the workpiece-carrying platform 1. Further, also each of the lift pins 8 passes through a through-hole 7 of the workpiece-carrying platform body 3, and is connected with a lifting/lowering drive mechanism 38 disposed under the workpiece-carrying platform body 3.

These lifting/lowering drive mechanisms 34, 38 may be constructed by combining cylinders or drive motors, rack gears and like components. In this case, the lifting/lowering ring plate 4 and the lifting/lowering drive mechanisms 34, 38 of the lift pins 8 may use a common drive force.

A plurality of air holes 11, 12 are provided in each of the lifting/lowering ring plate 4 and the workpiece-carrying platform body 3, and are open at the workpiece-carrying surface. These air holes 11, 12 serve as vacuum suction holes or air blow holes in use. It is possible for the air hole to serve as both the vacuum suction air hole and the air blow hole by switching the connection of such air hole by means of a suitable switching means such as valves and the like.

More particularly, each of the air holes 11, 12 is connected with pipes 21, 22. The pipe 21 is connected with the air hole 11 of the lifting/lowering ring plate 4 and communicated with a through-hole 23 provided in the bottom portion of the receiving groove 5 of the workpiece-carrying platform body 3.

The workpiece-carrying surface of the workpiece-carrying platform 1, which is constructed of the workpiece-carrying platform body 3 and the lifting/lowering ring plate 4, is provided with a fine irregularity for reducing the contact area of the substrate "G", provided that the fine irregularity is provided to such an extent that the irregularity does not impair the workpiece-carrying surface in heat conductivity with the substrate "G".

Now, the treatment of the substrate "G" will be described.

In mounting the substrate "G" on the workpiece-carrying platform 1, the lift pins 8 are lifted to mount the substrate "G" thereon. Under such circumstances, then the lift pins 8 are lowered to a position lower than the workpiece-carrying surface, so that the substrate "G" is transferred to the workpiece-carrying surface (i.e., upper surface) of the workpiece-carrying platform 1. As for the lifting/lowering ring plate 4, it may be lifted at this stage, or may be previously lifted.

When the substrate "G" has been mounted on the workpiece-carrying platform 1, the substrate "G" is sucked by means of both the air holes 11 of the lifting/lowering ring plate 4 and the air holes 12 of the workpiece-carrying platform body 3, so that the entire surface of the substrate "G" is brought into close contact with the workpiece-carrying surface, which makes it possible to improve the workpiece-carrying surface in heat conductivity with the substrate "G". At the same time, it is also possible to prevent the substrate "G" from breaking due to its misalignment in location. FIGS. 1(a) and 4(a) show the above stage.

In such heat treatment described above, since the heater 10 is incorporated in the lifting/lowering ring plate 4 of the apparatus of the present invention, it is possible to uniformly heat the substrate "G". After completion of such heat treatment, the substrate "G" is separated from the workpiece-carrying platform 1. At this time, first as shown in FIGS. 1(b) and 4(b), the lifting/lowering ring plate 4 is lowered to have its workpiece-carrying surface separated from the substrate "G".

At this time, the substrate "G" is sucked by means of the air holes 12 of the workpiece-carrying platform body 3, while the air holes 11 of the lifting/lowering ring plate 4 blows the air, which makes it possible to smoothly separate the substrate "G" from the workpiece-carrying surface of the lifting/lowering ring plate 4. After that, the vacuum suction of the substrate "G" is stopped, and, as shown in FIGS. 1(c) and 4(c), the lift pins 8 are lifted to lift and separate the substrate "G" from the workpiece-carrying surface of the workpiece-carrying platform body 3.

As described above, in the present invention, the separation of the substrate "G" from the workpiece-carrying platform 1 is carried out in two steps so as to reduce the contact area of the substrate "G" stepwise. Consequently, in comparison with the case where the separation of the substrate "G" from the workpiece-carrying platform 1 is carried out at a time, it is possible for the present invention to reduce the amount of electrostatic charges built up in the substrate "G" at a time when the substrate "G" is separated from the workpiece-carrying surface. As a result, it is possible for the present invention to smoothly separate the substrate "G" from the workpiece-carrying platform 1 without any fear of building up of elecrostatic charges in the substrate "G".

Particularly, since the fine irregularity is provided in the workpiece-carrying surface of each of the workpiece-carrying platform body 3 and the lifting/lowering ring plate 4 in order to reduce the contact area, it is possible for the present invention to further reduce the fear of building up of the electrostatic charges.

Further, in this apparatus of the present invention, since the lifting/lowering ring plate 4 assumes a ring-like shape, it is possible for the lifting/lowering ring plate 4 to be brought into well-balanced contact with the substrate "G", which realizes the uniformity in heating of the substrate "G". Further, in separating the substrate "G" from the lifting/lowering ring plate 4, it is also possible to realize well-balanced separation of the contact area of the substrate "G", which makes it possible to effectively prevent the building up of electrostatic charges in the substrate "G" at a time when the substrate "G" is separated from the workpiece-carrying surface. Further, since the lifting/lowering ring plate 4 assumes the crossroads' traffic-rotary-like shape in plan view, it is possible to insert the heaters 10 into the four projections 4b of the lifting/lowering ring plate 4 from their end surfaces, which facilitates the connection of lead wires and the like.

Though the embodiments of the present invention have been described in detail with reference to the drawings, in concrete construction, the present invention is not limited to the above embodiments only. Any modifications and changes in design not departing from the spirit of the present invention belong to the present invention. For example, the lifting/lowering ring plate 4 may assume any shapes such as square shapes, double circular shapes and the like in addition to the ring-like shapes. Further, gases issued from the air holes 11, 12 may be any gases such as ionized air, and inert gases such as nitrogen gas and the like in addition to the air. The inert gases and the like are advantageous in that they may effectively prevent the building up of electrostatic charges.

Further, in the above embodiments of the present invention, though the present invention is constructed in a manner such that the lifting/lowering ring plate 4 is lowered and the lift pins 8 is lifted to lift the substrate "G", it is also possible to construct the present invention in a manner such that the substrate "G" is directly lift by the lifting/lowering ring plate 4 itself by lifting the lifting/lowering ring plate 4 to a position higher than the workpiece-carrying surface of the workpiece-carrying platform body 3. In such a case, it is possible to remove the lift pins, which makes it possible to dissipate a fear that a rear surface of the substrate "G" is subjected to the lift pin's impression.

Further, though the resist applying developing system to which the apparatus of the present invention for heat-treating the substrate is applied has been described in the above, it is also possible for the apparatus of the present invention to be applied to any other systems such as orientation pre-baking unit, etching liquid applying developing units and the like.

As described above, according to the first aspect of the present invention: the workpiece-carrying platform is divided into the workpiece-carrying platform body and the lifting/lowering ring; and, the lifting/lowering ring plate is combined with the workpiece-carrying platform body in a manner such that the lifting/lowering ring plate is lifted and lowered relative to the workpiece-carrying platform body by means of the lifting/lowering mechanism.

Consequently, in separating the substrate "G" from the wokpiece-carrying surface, first the lifting/lowering ring plate 4 is lowered to separate the substrate "G" from the wokpiece-carrying surface of the lifting/lowering ring plate 4. After that, the lift pins 8 are lifted to separate the substrate "G" from the wokpiece-carrying surface of the workpiece-carrying platform body 3.

In other words, as described above, in the present invention, it is possible to carry out the separation of the substrate "G" from the workpiece-carrying surface in tow steps, which makes it possible to reduce the contact area of the substrate "G" stepwise. Consequently, in comparison with the case where the entire surface of the substrate "G" is separated from the workpiece-carrying surface at a time, it is possible for the present invention to reduce the amount of electrostatic charges built up at a time of the separation of the substrate "G" from the the workpiece-carrying surface, which makes it possible to prevent the substrate "G" from being damaged or broken due to the building up of electrostatic charges, and also makes it possible to realize the uniform heat treatment of the substrate "G". Further, in the present invention, since a fear that the electrostatic charges are built up in the substrate "G" is reduced, it is possible to prevent particles from occurring, and any failure occurring in the production of the devices may be previously avoided, which improves the product in the yield.

According to the second aspect of the present invention, the heater is incorporated in the lifting/lowering ring plate. Consequently, it is possible for the apparatus of the present invention to improve in uniformity its heating operation of the substrate.

According to each of the third and the fourth aspect of the present invention, the fine irregularity is formed in the workpiece-carrying surface of the workpiece-carrying platform. Consequently, it is possible for the apparatus of the present invention to reduce the contact area of the workpiece-carrying surface, through which contact area the workpiece-carrying surface is brought into contact with the substrate. Due to such reduction of the contact area, it is also possible to reduce the fear of the building up of electrostatic charges at a time of the separation of the substrate.

According to each of the fifth to seventh aspects of the present invention, the workpiece-carrying platform body of the workpiece-carrying platform is provided with a receiving groove, and the lifting/lowering ring plate is received in the receiving groove so as to be capable of being lifted and lowered. Consequently, it is possible for the apparatus of the present invention to use the side wall of the receiving groove as a guide means for steadily lifting and lowering the lifting/lowering ring plate.

According to the eighth aspect of the present invention, provided in the receiving groove is a stopper means for stopping the lifting/lowering plate in a position where the workpiece-carrying surface of the lifting/lowering ring plate reaches the same level as that of the workpiece-carrying platform body. Consequently, it is possible for the apparatus of the present invention to improve the heat conduction from the workpiece-carrying platform to the substrate, which makes it possible to improve in uniformity the heating operation of the substrate.

According to the ninth to thirteenth aspects of the present invention, the lifting/lowering ring plate is provided with the ring portion. Consequently, it is possible for the apparatus of the present invention to accomplish the well-balanced mounting of the substrate on the ring portion, which improves in uniformity the heating operation of the substrate. Further, in separating the lifting/lowering ring plate from the substrate, it is also possible to accomplish the well-balanced separation of the contact area of the substrate or of the lifting/lowering ring plate, which prevents the building up of electrostatic charges. Further, since the lifting/lowering ring plate is provided with the four projections around the outer periphery of the ring portion, it is possible to incorporate the heaters in these projections, which facilitates the connection of lead wires.

According to the fourteenth to nineteenth aspects of the present invention, each of the workpiece-carrying platform body and the lifting/lowering ring plate of the workpiece-carrying platform is provided with the vacuum suction holes and the air blow holes. Consequently, it is possible for the apparatus of the present invention to have the substrate brought into close contact with the workpiece-carrying platform under the influence of vacuum suction, which improves the heating operation of the substrate in uniformity and efficiency.

Further, by blowing the air, it is possible to enhance the separation of the substrate from the workpiece-carrying platform. Particularly, by blowing the air in the lifting/lowering ring plate in a condition in which the substrate is sucked in the workpiece-carrying platform body, it is possible to smoothly separate the lifting/lowering ring plate from the substrate.

According to the twentieth to thirty-eighth aspects of the present invention, the separation of the substrate from the workpiece-carrying surface is carried out in two steps, which makes it possible to reduce stepwise the contact area between the substrate and the workpiece-carrying surface. Therefore, in comparison with cases where the entire area of the substrate is separated from the workpiece-carrying surface at a time, it is possible for the method of the present invention to reduce the amount of electrostatic charges built up at a time of the separation of the substrate from the workpiece-carrying surface.

According to the thirty-ninth aspect of the present invention, it is possible to eliminate the lift pins by directly lifting the substrate from the workpiece-carrying platform body by lifting the lifting/lowering ring plate when the substrate is separated from the workpiece-carrying platform. Further, since the lifting/lowering ring plate shares the workpiece-carrying surface with the workpiece-carrying platform body, part of the contact area of the substrate is separated when the lifting/lowering ring plate is lifted, and the remaining part of the contact area is separated when the substrate resting on the lifting/lowering ring plate is lifted by another means.

Consequently, it is possible for the present invention to reduce the contact area stepwise. Due to this, in comparison with the case where the entire surface of the substrate is separated from the workpiece-carrying surface at a time, it is possible for the present invention to reduce the amount of electrostatic charges built up at a time when the substrate is separated from the workpiece-carrying surface, which makes it possible to prevent the substrate from being damaged or broken due to the building up of electrostatic charges, and realizes the uniform heat treatment of the substrate. Further, since the fear of building up of electrostatic charges is reduced in the present invention, it is possible to prevent the particles from occurring and also possible to previously avoid any failure occurring in the production of the device, which improves the product in the yield.

It is thus apparent that the present invention is not limited to the above embodiments but maybe changed and modified without departing from the scope and spirit of the invention.

Finally, the present application claims the priority of Japanese Patent Application No. Hei10-053243 filed on Mar. 5, 1998, which is herein incorporated by reference.

What is claimed is:

1. An apparatus for heat-treating a substrate comprising:
   a workpiece-carrying platform having a work-piece carrying surface for carrying and heating a substrate thereon, said workpiece-carrying platform including, a platform body that forms a first essential portion of said workpiece-carrying surface, and a lifting/lowering ring plate that forms a second remaining portion of said workpiece-carrying surface, said lifting/lowering ring plate contained within said platform body such that the ring plate can be lowered relative to said platform body by a lifting/lowering mechanism for separating the substrate from the second remaining portion of the workpiece-carrying surface;
   a heater element for supplying heat to said substrate, said heater element disposed in said workpiece-carrying platform; and
   at least one extendable and retractable lift pin disposed inside said workpiece carrying platform for lifting said substrate from said workpiece-carrying surface.

2. The apparatus for heat-treating the substrate, as set forth in claim 1, wherein:
   a heater is incorporated in said lifting/lowering ring plate.

3. The apparatus for heat-treating the substrate, as set forth in claim 1, wherein:
   a fine irregularity is formed in said workpiece-carrying surface of said workpiece-carrying platform to reduce a contact area between said workpiece-carrying surface and said substrate.

4. The apparatus for heat-treating the substrate, as set forth in claim 2, wherein:
   a fine irregularity is formed in said workpiece-carrying surface of said workpiece-carrying platform to reduce a contact area between said workpiece-carrying surface and said substrate.

5. The apparatus for heat-treating the substrate, as set forth in claim 1, wherein:
   a receiving groove is provided in said platform body of said workpiece-carrying platform; and
   said receiving groove adapted for receiving said lifting/lowering ring plate such that said ring plate is capable of being lifted and lowered.

6. The apparatus for heat-treating the substrate, as set forth in claim 2, wherein:
   a receiving groove is provided in said platform body of said workpiece-carrying platform; and
   said receiving groove adapted for receiving said lifting/lowering ring plate such that said ring plate is capable of being lifted and lowered.

7. The apparatus for heat-treating the substrate, as set forth in claim 3, wherein:
   a receiving groove is provided in said platform body of said workpiece-carrying platform; and
   said receiving groove adapted for receiving said lifting/lowering ring plate such that said ring plate is capable of being lifted and lowered.

8. The apparatus for heat-treating the substrate, as set forth in claim 5, wherein:
   a stopper means is disposed in said receiving groove for stopping said lifting/lowering ring plate in a position where said second remaining portion of said workpiece-carrying surface reaches the same level as that of said first essential portion of said workpiece-carrying surface, such that said workpiece-carrying surface is flat.

9. The apparatus for heat-treating the substrate, as set forth in claim 1, wherein:
   said lifting/lowering ring plate having a ring portion with four projections disposed at approximately 90 degree intervals around an outer peripheral portion of said ring portion;
   whereby said lifting/lowering ring plate appears as a crossroads' traffic-rotary-like shape in plan view.

10. The apparatus for heat-treating the substrate, as set forth in claim 2, wherein:

said lifting/lowering ring plate having a ring portion with four projections disposed at approximately 90 degree intervals around an outer peripheral portion of said ring portion;

whereby said lifting/lowering ring plate appears as a crossroads' traffic-rotary-like shape in plan view.

11. The apparatus for heat-treating the substrate, as set forth in claim 3, wherein:

said lifting/lowering ring plate having a ring portion with four projections disposed at approximately 90 degree intervals around an outer peripheral portion of said ring portion;

whereby said lifting/lowering ring plate appears as a crossroads' traffic-rotary-like shape in plan view.

12. The apparatus for heat-treating the substrate, as set forth in claim 4, wherein:

said lifting/lowering ring plate having a ring portion with four projections disposed at approximately 90 degree intervals around an outer peripheral portion of said ring portion;

whereby said lifting/lowering ring plate appears as a crossroads' traffic-rotary-like shape in plan view.

13. The apparatus for heat-treating the substrate, as set forth in claim 5, wherein:

said lifting/lowering ring plate having a ring portion with four projections disposed at approximately 90 degree intervals around an outer peripheral portion of said ring portion;

whereby said lifting/lowering ring plate appears as a crossroads' traffic-rotary-like shape in plan view.

14. The apparatus for heat-treating the substrate, as set forth in claim 1, wherein:

each of said platform body and said lifting/lowering ring plate is provided with at least one vacuum suction hole and at least one air blow hole.

15. The apparatus for heat-treating the substrate, as set forth in claim 2, wherein:

each of said platform body and said lifting/lowering ring plate is provided with at least one vacuum suction hole and at least one air blow hole.

16. The apparatus for heat-treating the substrate, as set forth in claim 3, wherein:

each of said platform body and said lifting/lowering ring plate is provided with at least one vacuum suction hole and at least one air blow hole.

17. The apparatus for heat-treating the substrate, as set forth in claim 4, wherein:

each of said platform body and said lifting/lowering ring plate is provided with at least one vacuum suction hole and at least one air blow hole.

18. The apparatus for heat-treating the substrate, as set forth in claim 5, wherein:

each of said platform body and said lifting/lowering ring plate is provided with at least one vacuum suction hole and at least one air blow hole.

19. The apparatus for heat-treating the substrate, as set forth in claim 6, wherein:

each of said platform body and said lifting/lowering ring plate is provided with at least one vacuum suction hole and at least one air blow hole.

20. A method for separating a substrate from a substrate heat-treating apparatus including a workpiece-carrying platform including a platform body that forms a first portion of a workpiece-carrying surface, and a lifting/lowering ring plate that forms a second portion of the workpiece-carrying surface, said lifting/lowering ring plate contained within said platform body such that the ring plate can be lowered relative to said platform body by a lifting/lowering mechanism; a heater element for supplying heat to said substrate, said heater element disposed in said workpiece-carrying platform; and at least one extendable and retractable lift pin disposed inside said workpiece carrying platform for lifting said substrate from said workpiece-carrying surface, said separating method comprising:

lowering the ring plate of the work-piece-carrying platform such that the second portion of the workpiece-carrying surface is separated from the substrate; and lifting the lift pin to separate the substrate from the first portion of the workpiece-carrying surface.

21. The method for separating the substrate from the apparatus for heat-treating the substrate, as set forth in claim 20, wherein:

a heater is incorporated in said lifting/lowering ring plate.

22. The method for separating the substrate from the apparatus for heat-treating the substrate, as set forth in claim 20, wherein:

a fine irregularity is formed in said workpiece-carrying surface of said workpiece-carrying platform to reduce a contact area of said workpiece-carrying surface, through which contact area said workpiece-carrying surface is brought into contact with said substrate.

23. The method for separating the substrate from the apparatus for heat-treating the substrate, as set forth in claim 21, wherein:

a fine irregularity is formed in said workpiece-carrying surface of said workpiece-carrying platform to reduce a contact area of said workpiece-carrying surface, through which contact area said workpiece-carrying surface is brought into contact with said substrate.

24. The method for separating the substrate from the apparatus for heat-treating the substrate, as set forth in claim 20, wherein:

said workpiece-carrying platform body of said workpiece-carrying platform is provided with a receiving groove; and said lifting/lowering ring plate is received in said receiving groove so as to be capable of being lifted and lowered.

25. The method for separating the substrate from the apparatus for heat-treating the substrate, as set forth in claim 21, wherein:

said workpiece-carrying platform body of said workpiece-carrying platform is provided with a receiving groove; and said lifting/lowering ring plate is received in said receiving groove so as to be capable of being lifted and lowered.

26. The method for separating the substrate from the apparatus for heat-treating the substrate, as set forth in claim 22, wherein:

said workpiece-carrying platform body of said workpiece-carrying platform is provided with a receiving groove; and said lifting/lowering ring plate is received in said receiving groove so as to be capable of being lifted and lowered.

27. The method for separating the substrate from the apparatus for heat-treating the substrate, as set forth in claim 20, wherein:

provided in said receiving groove is a stopper means for stopping said lifting/lowering plate in a position where said workpiece-carrying surface of said lifting/lowering ring plate reaches the same level as that of said workpiece-carrying platform body.

28. The method for separating the substrate from the apparatus for heat-treating the substrate, as set forth in claim 20, wherein:

said lifting/lowering ring plate is constructed of a ring portion and four projections disposed around an outer peripheral portion of said ring portion, said four projections being spaced apart from each other at equal angular intervals of approximately 90 degrees;

whereby said lifting/lowering ring plate assumes a crossroads' traffic-rotary-like shape in plan view.

29. The method for separating the substrate from the apparatus for heat-treating the substrate, as set forth in claim 21, wherein::

said lifting/lowering ring plate is constructed of a ring portion and four projections disposed around an outer peripheral portion of said ring portion, said four projections being spaced apart from each other at equal angular intervals of approximately 90 degrees;

whereby said lifting/lowering ring plate assumes a crossroads' traffic-rotary-like shape in plan view.

30. The method for separating the substrate from the apparatus for heat-treating the substrate, as set forth in claim 22, wherein:

said lifting/lowering ring plate is constructed of a ring portion and four projections disposed around an outer peripheral portion of said ring portion, said four projections being spaced apart from each other at equal angular intervals of approximately 90 degrees;

whereby said lifting/lowering ring plate assumes a crossroads' traffic-rotary-like shape in plan view.

31. The method for separating the substrate from the apparatus for heat-treating the substrate, as set forth in claim 23, wherein:

said lifting/lowering ring plate is constructed of a ring portion and four projections disposed around an outer peripheral portion of said ring portion, said four projections being spaced apart from each other at equal angular intervals of approximately 90 degrees;

whereby said lifting/lowering ring plate assumes a crossroads' traffic-rotary-like shape in plan view.

32. The method for separating the substrate from the apparatus for heat-treating the substrate, as set forth in claim 24, wherein:

said lifting/lowering ring plate is constructed of a ring portion and four projections disposed around an outer peripheral portion of said ring portion, said four projections being spaced apart from each other at equal angular intervals of approximately 90 degrees;

whereby said lifting/lowering ring plate assumes a crossroads' traffic-rotary-like shape in plan view.

33. The method for separating the substrate from the apparatus for heat-treating the substrate, as set forth in claim 20, wherein:

each of said workpiece-carrying platform body and said lifting/lowering ring plate of said workpiece-carrying platform is provided with a vacuum suction hole and an air blow hole.

34. The method for separating the substrate from the apparatus for heat-treating the substrate, as set forth in claim 21, wherein:

each of said workpiece-carrying platform body and said lifting/lowering ring plate of said workpiece-carrying platform is provided with a vacuum suction hole and an air blow hole.

35. The method for separating the substrate from the apparatus for heat-treating the substrate, as set forth in claim 22, wherein:

each of said workpiece-carrying platform body and said lifting/lowering ring plate of said workpiece-carrying platform is provided with a vacuum suction hole and an air blow hole.

36. The method for separating the substrate from the apparatus for heat-treating the substrate, as set forth in claim 23, wherein:

each of said workpiece-carrying platform body and said lifting/lowering ring plate of said workpiece-carrying platform is provided with a vacuum suction hole and an air blow hole.

37. The method for separating the substrate from the apparatus for heat-treating the substrate, as set forth in claim 24, wherein:

each of said workpiece-carrying platform body and said lifting/lowering ring plate of said workpiece-carrying platform is provided with a vacuum suction hole and an air blow hole.

38. The method for separating the substrate from the apparatus for heat-treating the substrate, as set forth in claim 25, wherein:

each of said workpiece-carrying platform body and said lifting/lowering ring plate of said workpiece-carrying platform is provided with a vacuum suction hole and an air blow hole.

39. An apparatus for heat-treating a substrate comprising:

a workpiece-carrying platform including a platform body forming an essential portion of a workpiece-carrying surface, and a lifting/lowering ring plate forming a remaining portion of said workpiece-carrying surface, said lifting/lowering ring plate contained within said platform body such that the lifting/lowering ring plate can be lowered relative to said platform body by a lifting/lowering mechanism for separating said substrate from said remaining portion of said workpiece-carrying surface;

a heater element for supplying heat to said substrate, said heater element disposed in said workpiece-carrying platform;

at least one extendable and retractable lift pin disposed inside said workpiece carrying platform for lifting the substrate from said workpiece-carrying surface; and a lifting/lowering drive mechanism contained within said work-piece-carrying platform for lifting and lowering said ring plate relative to said platform body.

40. The apparatus for heat-treating substrates according to claim 39, wherein said workpiece-carrying platform has two positions for heat-treating a substrate;

a heating position, achieved when said lifting/lowering ring plate and said platform body are positioned such that both portions of said workpiece-carrying surface are substantially flush; and a separating position, achieved when said lifting/lowering ring plate is lowered such that said substrate is separated from said remaining portion of said work-piece-carrying surface.

* * * * *